United States Patent
Nam et al.

(10) Patent No.: US 6,541,730 B2
(45) Date of Patent: Apr. 1, 2003

(54) METHOD AND APPARATUS FOR CUTTING A NON-METAL SUBSTRATE BY USING A LASER BEAM

(75) Inventors: Hyung-Woo Nam, Yeonggi-do-do (KR); Dae-Ho Choo, Gyenggi-do (KR); Baek-Kyun Jeon, Gyenoggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/978,040

(22) Filed: Oct. 17, 2001

(65) Prior Publication Data

US 2002/0046997 A1 Apr. 25, 2002

(30) Foreign Application Priority Data

Oct. 21, 2000 (KR) .............................................. 00-62131

(51) Int. Cl.[7] .............................................. B23K 26/38
(52) U.S. Cl. .................................................. 219/121.67
(58) Field of Search ........................ 219/121.6, 121.67, 219/121.72, 121.73, 121.76, 121.84, 121.85

(56) References Cited

U.S. PATENT DOCUMENTS 5,290,274 A * 3/1994 Levy et al.

* cited by examiner

Primary Examiner—Samuel M. Heinrich
(74) Attorney, Agent, or Firm—McGuireWoods LLP; Hae-Chan Park

(57) ABSTRACT

Disclosed are an apparatus and a method for cutting a non-metal substrate. A laser device generates a first laser beam onto a cutting route formed in the non-metal substrate for heating the cutting route such that a scribe line is formed on the cutting route. The laser device also generates a second laser beam, which is spaced by a predetermined distance from the first laser beam, such that a beam pattern is formed along a radiating route of the first laser beam. A cooling device forms a crack by applying a cooling fluid beam onto the cutting route formed between the first laser beam and the second laser beam. After applying the cooling fluid beam, the non-metal substrate is cut by using one beam pattern, to simplify an optical system. A great tensile force is generated in the scribe line, so the thick non-metal substrate can be completely cut at once.

31 Claims, 5 Drawing Sheets

METHOD AND APPARATUS FOR CUTTING A NON-METAL SUBSTRATE BY USING A LASER BEAM

BACKGROUND OF THE INVENTION

1. Field of the Invention

The present invention relates to a method and an apparatus for precisely cutting a flat type non-metal substrate, such as glass or silicon, into a plurality of pieces. More particularly, the present invention relates to a method and an apparatus for cutting a non-metal substrate, wherein a cutting laser beam which follows a scribing laser beam for cutting the non-metal substrate made of a non-metal material, such as glass or silicon is generated in a cutting route so that the non-metal substrate is precisely cut along the predetermined cutting route.

2. Description of the Related Art

Recently, as a semiconductor thin film manufacturing technique is developed, a semiconductor industry has technologically advanced in manufacturing high integration and high performance semiconductor articles. In the semiconductor article, tens of thousands semiconductor devices are integrated on one substrate of high purity by thin film manufacturing processes. The substrate referred to a wafer is made of single crystalline silicon, which is one of non-metal material. The semiconductor article stores data in the form of digital signals and arithmetically treats the stored data in a minute.

In addition, as an application of the semiconductor industry, a liquid crystal display (LCD) technique, which displays an image by converting an analog signal processed in a data processing unit to a digital signal, is rapidly progressed. In the liquid crystal display device, liquid crystal molecules are filled between two transparent substrates. The liquid crystal display device changes the alignment of liquid crystal molecules by applying an electric field to the liquid crystal molecules. By changing the alignment of liquid crystal molecules, optical properties of liquid crystal cells such as birefringence, circumpolarization, dichroism, light scattering, and so on, change to display various images.

The semiconductor device and the liquid crystal display device are commonly formed on a non-metal substrate, such as a silicon substrate of high purity or a glass substrate. Though the non-metal substrate is weak against the external impact, the non-metal substrate has the advantage that a plurality of semiconductor chips or a plurality of cell units formed on the wafer or on the glass substrate can be easily sliced into an individual semiconductor chip or a cell unit.

In case of the semiconductor device, hundreds of semiconductor chips are simultaneously formed on one wafer. Then, semiconductor chips are individually cut by a cutting process. After that, a packaging process is carried out with respect to the semiconductor chip thereby forming the semiconductor article.

In case of the liquid crystal display device, at least two LCD cell units are simultaneously formed on the glass substrate called as a motherboard. Then, after cutting the LCD cell unit from the motherboard by the cutting process, the cell unit is assembled with PCBs and so on.

At this time, since the cutting process is the almost final step in the manufacturing processes, the cutting fault reduces the productivity of the articles. Particularly, the motherboard used in the liquid crystal display device is made of glass and has no crystal structure. Accordingly, the motherboard is weaker than the silicon wafer. For this reason, a fine crack formed at an edge portion of the motherboard during the cutting process amplifies stress along the fine crack. This may cut undesired portions of the motherboard when executing the cutting process.

Conventionally, a diamond blade with fine diamonds fixed at a circumferential portion of a disc rotates at a high speed, on the cutting route to form a scribe line of a predetermined depth on a substrate. Then, the substrate is cracked along the scribe line by an external impact, thereby cutting the semiconductor chip or LCD cell unit from the wafer or the glass motherboard.

When cutting the substrate by using the diamond blade, a predetermined cutting margin is prepared on the wafer or the glass motherboard, limiting the number of semiconductor chips formed on the wafer if the cutting process is not precisely performed.

In case of the liquid crystal display device, a cutting plane cut by the diamond blade is roughly processed so that the stress is concentrated on the cutting plane. Accordingly, the external impact applied to the cutting plane generates crack and chipping portions in the cutting plane.

In addition, the diamond blade that generates a lot of glass particles requires separate cleaning and drying processes to remove the glass particles.

In order to solve the above problems, various cutting methods and apparatuses using a laser beam have been developed. For example, U.S. Pat. No. 4,467,168 discloses a cutting method by using a laser and a method for manufacturing articles by using the same. In addition, U.S. Pat. No. 4,682,003 discloses a method for cutting glass by using a laser beam and U.S. Pat. No. 5,622,540 discloses a method for cutting a glass substrate.

FIG. 1 shows a conventional apparatus for cutting a glass substrate by using a laser beam.

Referring to FIG. 1, a laser beam 1 is irradiated along a cutting route 3 of a glass motherboard 2 so as to rapidly heat the cutting route 3. Then, a cooling fluid beam 4 having the temperature extremely lower than the temperature of the heated glass motherboard 2 is radiated along the cutting route 3 such that the glass motherboard 2 is cut along the cutting route 3 by means of the tensile force caused by the rapid expansion and shrink of the glass motherboard 2.

The cutting apparatus shown in FIG. 1 can cut a relatively thin glass motherboard at once. Recently, the liquid crystal display device is required to have a large size so that the surface area and the thickness of the glass motherboard become increased. Especially, the present glass motherboard has the thickness over 0.5 mm. Accordingly, in order to cut the glass motherboard having the thickness over 0.5 mm at once, the laser beam 1 is required to have the extremely high energy level.

When the energy level of the laser beam I irradiated onto the glass motherboard 2 increases, the temperature difference between the cutting route 3 of the glass motherboard 2 and a periphery portion of the cutting route 3 is greatly increased. This temperature difference creates cracks, before the cooling fluid beam 4 cools the cutting route 2 at portions of the glass motherboard 2 where the temperature difference is greatly increased, cutting undesired portions of the glass motherboard.

In order to solve the above problem, an apparatus for cutting a glass substrate without using the laser beam having the high energy level is developed. The cutting apparatus is shown in FIG. 2.

In FIG. 2, a scribing laser beam 13 is irradiated along a cutting route 12 of a glass motherboard 10 so as to rapidly heat the cutting route 12. Then, a cooling fluid beam 14 having the temperature extremely lower than the temperature of the heated glass motherboard 10 is applied along the cutting route 12. Then, the glass motherboard 10 is rapidly cooled so that a crack having a predetermined depth is formed on the surface of the glass motherboard 10, thereby forming a scribe line 15. After that, both sides of the glass motherboard 10 are rapidly heated about the scribe line 15. Accordingly, both sides of the glass motherboard 10 are rapidly expanded so that a great tensile force is generated at the scribe line 15. As a result, the glass motherboard 10 is completely cut along the scribe line 15.

According to the cutting apparatus as shown in FIG. 2, the scribe line 15 can be formed even when the temperature difference between the heated cutting route 12 and the cooled cutting route 12 is not widely formed. In addition, since a shear stress is increased as the temperature difference between the scribe line 15 and a periphery portion of the scribe line 15 is increased, the cutting apparatus can cut a relatively thick glass motherboard at once.

However, since the cutting apparatus shown in FIG. 2 cuts the glass motherboard by using at least two beam patterns after radiating the cooling fluid beam, there is required to adjust the quantity and intensity of the beam patterns. In addition, the beam patterns have to be symmetrically adjusted so as to linearly cut the glass motherboard. Much time is necessary for symmetrically adjusting the beam patterns. Furthermore, since the laser beam has to form at least two beam patterns, a separate device such as beam splitter is required, complicating the optical system.

SUMMARY OF THE INVENTION

Therefore, it is a first object of the present invention to provide a method for cutting a non-metal substrate made of glass or silicon with a simple structure of an optical system.

It is a second object of the present invention to provide an apparatus for suitably performing the cutting method.

To achieve the first object of the present invention, there is provided a method for cutting a non-metal substrate comprising the steps as follows.

A first area of a cutting route is rapidly heated by irradiating a first laser beam onto a cutting route which is predetermined on the non-metal substrate. A scribe line having a predetermined depth is formed by applying a cooling fluid beam onto the heated cutting route. Then, the scribe line is rapidly heated by irradiating a second beam along a radiating route of a first laser beam thereby completely cutting the non-metal substrate.

To achieve the second object of the present invention, there is provided an apparatus for cutting a non-metal substrate comprising a first means for generating a first laser beam onto a cutting route formed in the non-metal substrate for heating the cutting route such that a scribe line is formed on the cutting route and for generating a second laser beam, which is spaced by a predetermined distance from the first laser beam, to form a beam pattern along a radiating route of the first laser beam. A second means forms a crack by applying a cooling fluid beam onto the cutting route formed between the first laser beam and the second laser beam.

To achieve the second object of the present invention, according to another embodiment of the present invention, there is provided an apparatus for cutting a non-metal substrate comprising a first means for generating a first laser beam onto a cutting route formed in the non-metal substrate for heating the cutting route such that a scribe line is formed on the cutting route and for generating a second laser beam onto the scribe line while maintaining a predetermined distance from the first laser beam. A second means forms a crack by applying a cooling fluid beam into the cutting route formed between the first laser beam and the second laser beam.

According to the present invention, the non-metal substrate is cut by using one beam pattern after applying the cooling fluid beam, so an optical system is simplified. In addition, the time for adjusting the beam pattern and the beam intensity is reduced.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Hereinafter, the preferred embodiment of the present invention will be described with respect to the accompanying drawings.

Figure 1:
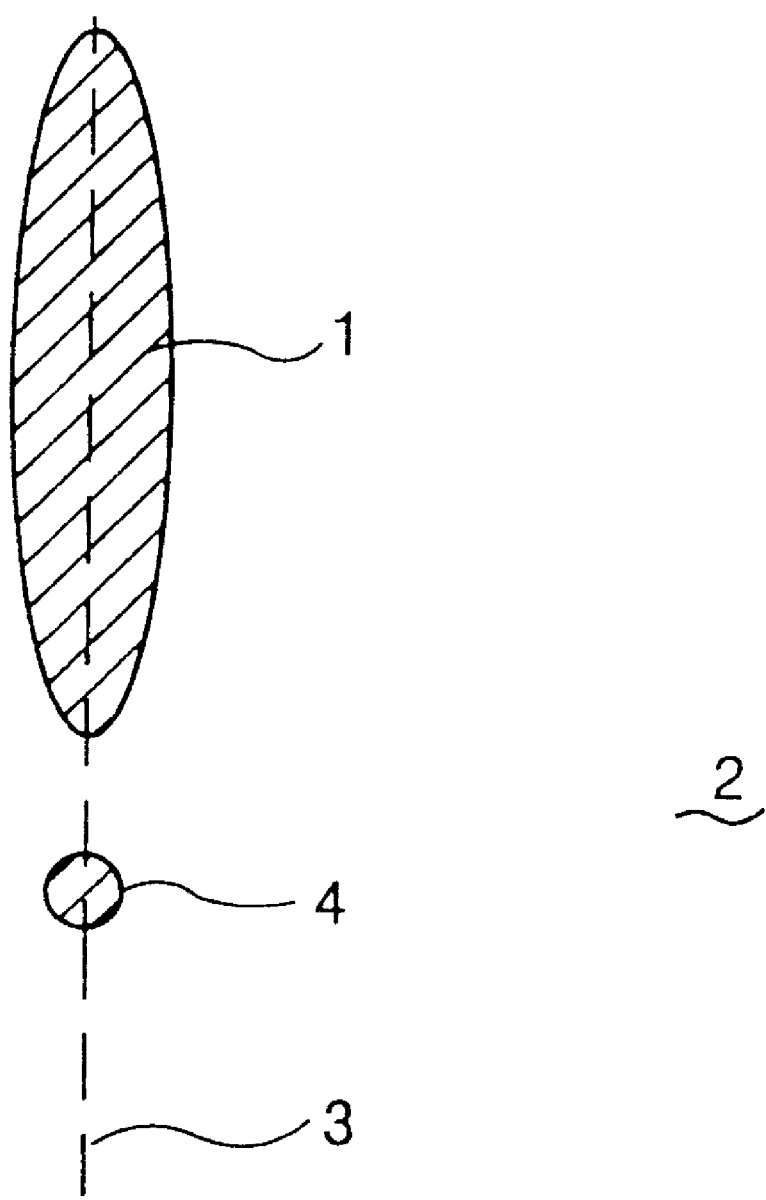
FIG. 1 is a schematic view showing a conventional apparatus for cutting a glass substrate by using a laser beam.
Figure 2:
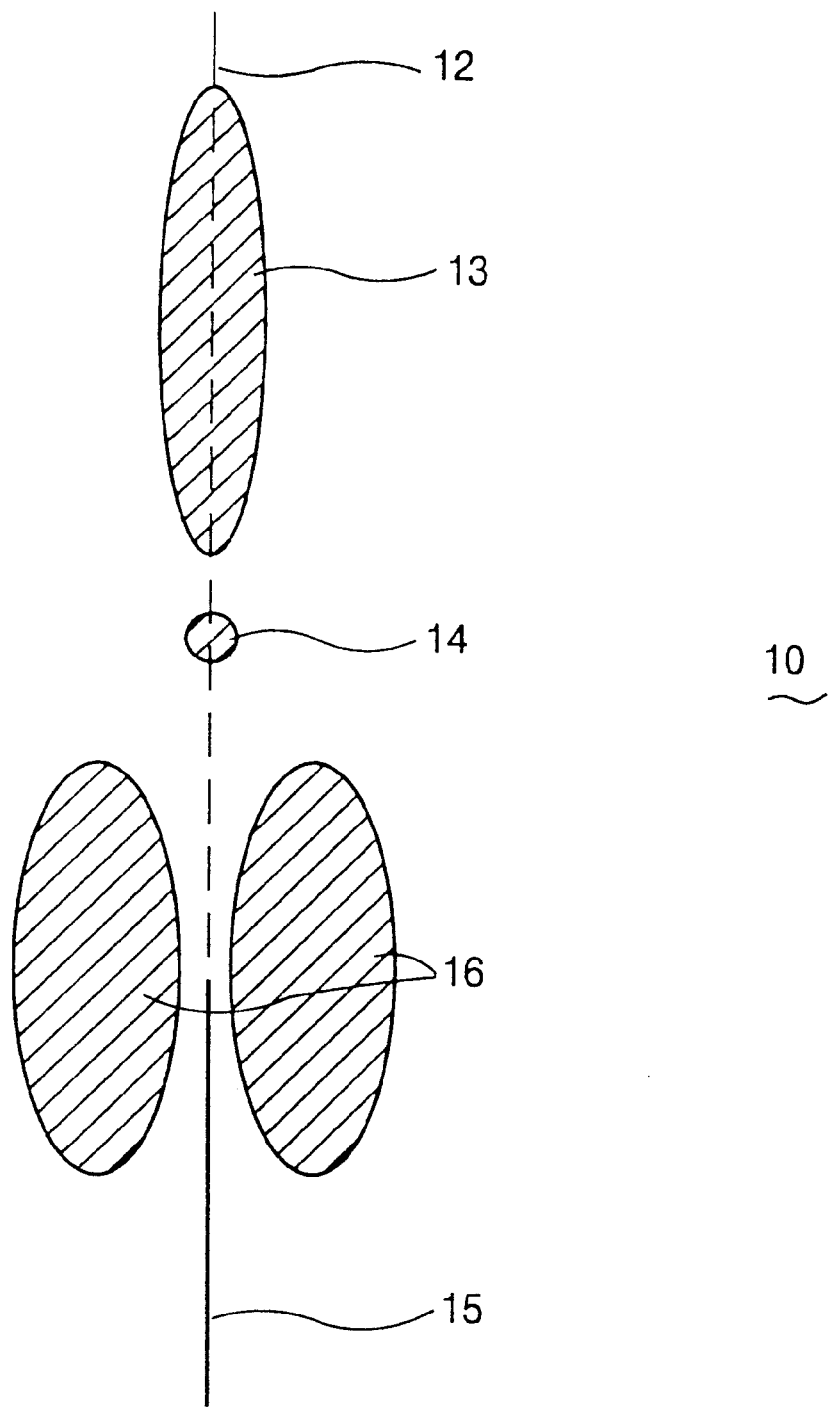
FIG. 2 is a schematic view showing another conventional apparatus for cutting a glass substrate by using a laser beam.
Figure 3:
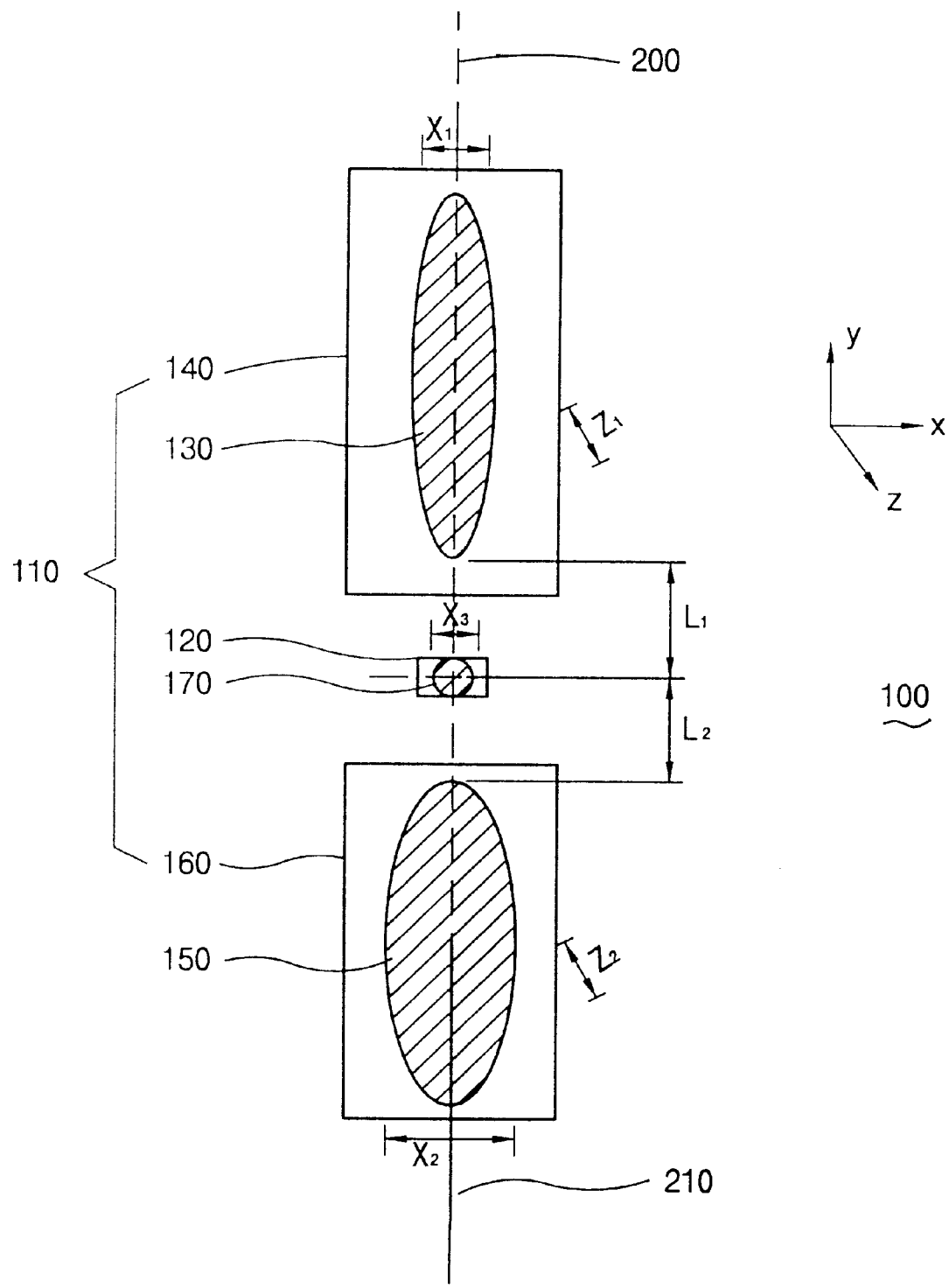
FIG. 3 is a schematic view showing the cutting mechanism of a glass substrate cutting apparatus according to one embodiment of the present invention.

FIG. 3 shows a schematic view explaining the cutting mechanism of a glass substrate cutting apparatus according to one embodiment of the present invention.

Referring to FIG. 3, the glass substrate cutting apparatus has a laser beam generating device 110 that generates laser beams for heating a cutting route 200 of a glass motherboard 100, a cooling device 120 that applies a cooling fluid beam into the heated glass motherboard 100 for forming a crack on the glass motherboard 100 along the cutting route (y-axis direction), and a conveying device (not shown) for conveying the laser beam generating device 110 and the cooling device 120 with respect to the glass motherboard 100.

In detail, the laser beam generating device 110 includes a first laser beam generating unit 140 for generating a scribing laser beam 130 and a second laser beam generating unit 160 for generating a cutting laser beam 150. The first laser beam generating unit 140 and the second laser beam generating unit 150 have a laser source, respectively. Alternatively, it is possible to divide the laser beam generated from one laser source by using a splitter.

The scribing laser beam 130 generated from the first laser beam generating unit 140 has a beam pattern with a long oval shape having a major axis and a minor axis. The scribing laser beam 130 is irradiated into the glass motherboard 100 while the major axis of the scribing laser beam 130 is aligned on the cutting route 200 of the glass motherboard 100.

The cutting laser beam 150 generated from the second laser beam generating unit 160 is spaced from the scribing laser beam 130 and is radiated into the glass motherboard 100 along the radiating route of the scribing laser beam 130. Preferably, the cutting laser beam 150 also has a beam pattern with a long oval shape having a major axis and a minor axis. The cutting laser beam 150 is irradiated into the glass motherboard 100 while the major axis of the cutting laser beam 130 is being aligned on the cutting route 200 of the glass motherboard 100. At this time, the cutting laser beam 150 has the temperature lower than or identical to the melting point of the glass motherboard 100.

In addition, a width ($x_2$) of the cutting laser beam 150 is larger than a width ($x_1$) of the scribing laser beam 130. In detail, the width ($x_1$) of the scribing laser beam 130 is no more than about 5 mm. And the width ($x_2$) of the cutting laser beam 150 is larger than the width ($x_1$) of the scribing laser beam 130 but is no more than about 20 mm.

A depth ($z_2$) of the cutting laser beam 150 is shallow than a depth ($z_1$) of the scribing laser beam 130. The depth of the laser beam means the intensity of the laser beam for the unit area. Accordingly, the scribing laser beam 130 has to be deep and narrowly irradiated onto the glass motherboard 100 so as to form the crack along the cutting route 200. On the other hand, the cutting laser beam 150 has to be shallow and widely irradiated to the glass motherboard 100 to avoid undesired cracks on the glass motherboard 100.

Figure 4:
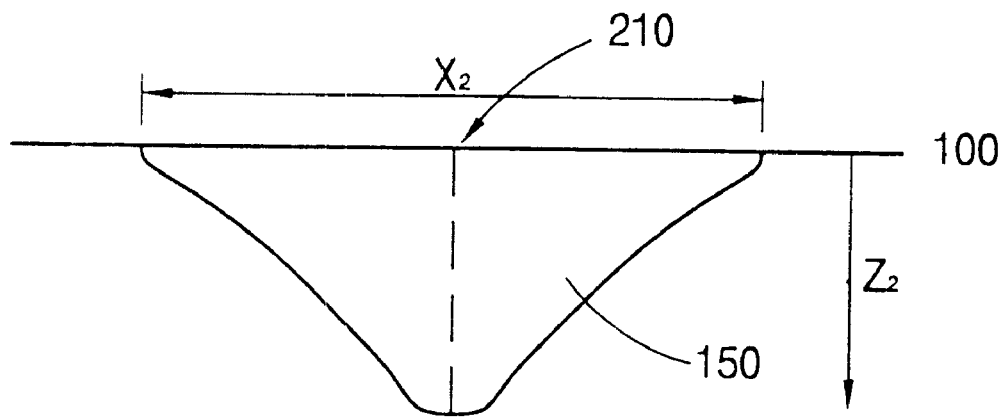
FIG. 4 is a view showing a heat distribution in a glass substrate caused by a cutting laser beam shown in FIG. 3.

FIG. 4 shows a heat distribution in the glass motherboard 100 caused by the cutting laser beam 150.

Referring to FIG. 4, the cutting laser beam 150 is irradiated onto a scribe line 210, which is formed along the cutting route 200 by the scribing laser beam 130 and a cooling fluid beam 170. Accordingly, the cutting laser beam 150 generates a great tensile force to the scribe line 210. At this time, since the cutting laser beam 150 is directly irradiated just above the scribe line 210, the crack portion is bonded if the scribe line 210 is heated above the melting point of glass. Therefore, the cutting laser beam should have a temperature lower than the melting point of glass.

Figure 5A:
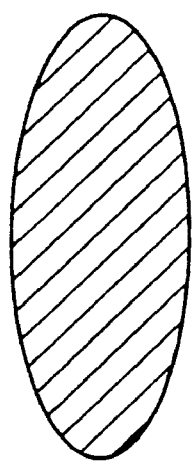
FIGS. 5A, 5B and 5C are plan views showing various beam patterns of the cutting laser beam.
Figure 5B:
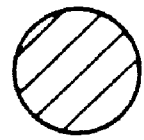
Figure 5C:
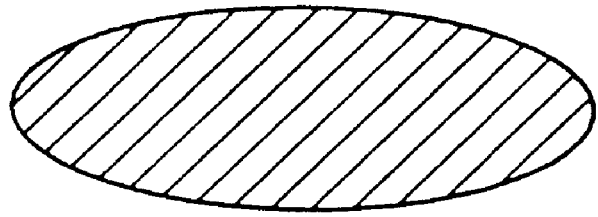

FIGS. 5A, 5B and 5C are plan views showing various beam patterns of the cutting laser beam 150.

FIG. 5A shows a beam pattern having a vertical oval shape. The beam pattern is adapted for increasing the cutting speed up to about 150 mm/sec.

FIG. 5B shows a beam pattern having a circular shape and FIG. 5C shows a beam pattern having a horizontal oval shape. The beam patterns shown in FIGS. 5B and 5C are adapted for increasing the cutting accuracy.

Since the cutting laser beam 150 forms only one beam pattern, the beam profile can be converted by using a cylindrical shape lens in which a concave lens and a convex lens are coupled to each other, so that an additional lens such as a beam splitter is not required. Accordingly, the optical system can be simplified.

For example, in a cylindrical shape lens having a concave lens at an upper surface where the laser beam is incident and a convex lens at a lower surface thereof, if the laser beam having a spot shape is incident into the concave lens, the shape of the laser beam is converted to a long oval shape. Then, if converted laser beam passes through the convex lens, a minor axis of the oval shape is further shortened and a major axis of the oval shape is further lengthened.

The cooling device 120 applies the cooling fluid beam 170 onto the cutting route 200 formed between the scribing laser beam 130 and the cutting laser beam 150. The cooling fluid beam 170 has a spot shape and uses cooling water or lower temperature cooling gas, such as lower temperature inert gas including liquid helium, nitrogen, and argon. In addition, in order to achieve the superior cooling effect, both cooling water and cooling gas can be simultaneously used. Preferably, a width ($x_3$) of the cooling fluid beam 170 is smaller than the width ($x_1$) of the scribing laser beam 130.

At this time, the position of the cooling fluid beam 170 is very important in order to cut the thick glass motherboard 100 at once.

In FIG. 3, the cooling fluid beam 170 is positioned at a portion spaced from a lower end of the major axis of the scribing laser beam 130 by a distance $L_1$ and spaced from an upper end of the major axis of the cutting laser beam 150 by a distance $L_2$.

The cooling fluid beam 170 cracks the substrate along the cutting route 200 heated by the scribing laser beam 130, thereby forming the scribe line 210 on a hypothetical (imaginary) cutting route. When the scribe line 210 is formed on the cutting route 200, the cutting laser beam 150 is irradiated into the scribe line 210. Accordingly, a great tensile force is generated in the scribe line 210 so that the glass motherboard 100 is completely cut along the scribe line 210.

At this time, if the position of the cooling fluid beam 170 is biased towards the scribing laser beam 130, that is, if the distance $L_2$ is longer than the distance $L_1$, the temperature of the glass motherboard 100 heated by the scribing laser beam 130 is rapidly cooled so that the scribe line 210 can be easily formed. Accordingly, it is preferred to apply the cooling fluid beam 170 onto a portion which makes contact with the lower end of the major axis of the scribing laser beam 130 (that is, $L_1=0$) or a portion, which is positioned just below the lower end of the major axis of the scribing laser beam 130 (that is, $L_1>0$). Alternatively, the cooling fluid laser beam 170 can be applied onto an area of the scribing laser beam 130 (that is, $L_1<0$). By applying the cooling fluid beam 170 onto the glass motherboard 100 in this manner, the local temperature difference of the glass motherboard 100 is maximized caused by the rapid heating and the rapid cooling.

In addition, the distance $L_2$ between the cooling fluid beam 170 and the cutting laser beam 150 is preferably formed as short as possible. The temperature difference between the scribe line 210 heated by the cutting laser beam 150 and periphery portions thereof is increased as the distance $L_2$ becomes shorter so that the shear stress is also increased. Accordingly, the thick glass motherboard 100 can be easily and completely cut at once.

Though the cutting laser beam 150 and the cooling fluid beam 170 can vary depending on the cutting speed and other conditions, it is preferred to form the cutting laser beam 150 and the cooling fluid beam 170 to be adjacent to each other. More preferably, the distance $L_2$ between the cooling fluid beam 170 and the cutting laser beam 150 is maintained no more than about 25 mm. For example, the distance $L_2$ is set to 16 mm when the cutting speed is about 200 to 250 mm/sec.

Hereinafter, a method for cutting the glass motherboard 100 by using the cutting apparatus shown in FIG. 3 will be described.

First, the scribing laser beam 130 is irradiated onto the glass motherboard 100 along the cutting route 200, thereby rapidly heating the first area of the cutting route 200. Then, cooling gas, cooling water, or a mixture thereof is applied along the scribing laser beam 130 such that the cutting route 200 is rapidly cooled. That is, the cooling fluid beam 170 is applied onto the second area of the cutting route 200 adjacent to the first area or applied onto the third area of the cutting route 200, which is spaced by a predetermined distance apart from the first area. Alternatively, the cooling fluid beam 170 can be applied onto the fourth area formed in the first area of the cutting route 200.

Accordingly, as shown in FIG. 3, the glass motherboard 100 heated by the scribing laser beam 130 is rapidly cooled by the cooling fluid beam 170 so that the crack having a predetermined depth is created on the surface of the glass motherboard 100 and the scribe line 210 is formed along the cutting route 200.

While the scribing laser beam 130 and the cooling fluid beam 170 are being moved along the cutting route 200, the cutting laser beam 150 is irradiated onto the glass motherboard 100 along the radiating route of the scribing laser beam 130, so that the scribe line 210 is rapidly heated again. At this time, the cutting laser beam 150 is irradiated just above the scribe line 210.

By irradiating the cutting laser beam 150 just above the scribe line 210, the great tensile force is generated in the scribe line 210 formed by the crack. Accordingly, the crack is linearly spread along the scribe line 210 to an underside of the glass motherboard 100, so that the glass motherboard 100 is completely cut.

As mentioned above, according to the present invention, the glass motherboard is cut by using one beam pattern after applying the cooling fluid beam along the scribe line, the time for adjusting the size and intensity of the beam pattern can be reduced. In addition, one beam pattern is formed by using one optical lens without using an additional lens, such as a beam splitter, simplifying the optical system. Furthermore, a great tensile force is generated in the scribe line by directly radiating the cutting laser beam into the scribe line, so the thick glass motherboard can be completely cut at once.

While the present invention has been described in detail, it should be understood that various changes, substitutions and alterations can be made hereto without departing from the spirit and scope of the invention as defined by the appended claims.

What is claimed is:

1. A method for cutting a non-metal substrate along a cutting route, comprising the steps of:
    rapidly heating a first area of of the cutting route by radiating a first laser beam onto the cutting route;
    forming a scribe line having a predetermined depth by irradiating a cooling fluid beam onto the first area; and
    rapidly heating the scribe line by radiating a second laser beam along the cutting id route irradiated by the first laser beam, thereby completely cutting the non-metal substrate.

2. The method as claimed in claim 1, wherein the second laser beam is irradiated directly on the scribe line.

3. The method as claimed in claim 1, wherein the second laser beam has a temperature lower than a melting point of the non-metal substrate.

4. The method as claimed in claim 1, wherein the first laser beam is narrower than the second laser beam and the cooling fluid beam is narrower than the first laser beam.

5. The method as claimed in claim 1, wherein the width of the first laser beam is narrower than 5 mm, and the width of the second laser beam is wider than the width of the first laser beam but narrower than 20 mm.

6. The method as claimed in claim 1, wherein the cooling fluid beam is irradiated onto a second area of the cutting route, the second area being adjacent to the first area of the cutting route.

7. The method as claimed in claim 1, wherein the cooling fluid beam is applied onto a third area of the cutting route, the third area being spaced by a predetermined distance from the first area of the cutting route.

8. The method as claimed in claim 7, wherein a distance between the cooling fluid beam and the first laser beam is no more than about 25 mm.

9. The method as claimed in claim 1, wherein the cooling fluid beam is irradiated onto a fourth area of the cutting route that is positioned inside of the first area.

10. The method as claimed in claim 1, wherein the second laser beam is irradiated in a circular shape or an oval shape.

11. An apparatus for cutting a non-metal substrate, comprising:
    a laser device that irradiates a first laser beam onto a cutting route on the non-metal substrate to form a scribe line along the cutting route and that irradiates a second laser beam spaced apart from the first laser beam and along the cutting route irradiated by the first laser beam; and
    a cooler that applies a cooling fluid beam to form a crack along the cutting route formed between the first laser beam and the second laser beam.

12. The apparatus as claimed in claim 11, wherein the second laser beam has a temperature lower than a melting point of the non-metal substrate.

13. The apparatus as claimed in claim 11, wherein the laser device includes a laser source for creating the first laser beam and the second laser beam.

14. The apparatus as claimed in claim 11, wherein the first laser beam is narrower than the second laser beam, and the cooling fluid beam is narrower than the first laser beam.

15. The apparatus as claimed in claim 11, wherein the first laser beam is narrower than 5 mm, and the second laser beam is wider than the first laser beam but narrower than 20 mm.

16. The apparatus as claimed in claim 11, wherein a distance between the first laser beam and the cooling fluid beam is larger than zero.

17. The apparatus as claimed in claim 16, wherein the distance between the first laser beam and the cooling fluid beam is no longer than about 25 mm.

18. The apparatus as claimed in claim 11, wherein a distance from the cooling fluid beam to a lower end of the first laser beam is less than zero.

19. The apparatus as claimed in claim 11, wherein a distance between the cooling fluid beam and the first laser beam is zero.

20. The apparatus as claimed in claim 11, wherein a depth of the second laser beam is shallower than a depth of the first laser beam.

21. The apparatus as claimed in claim 11, wherein the second laser beam has a circular shape or an oval shape.

22. An apparatus for cutting a non-metal substrate, comprising:
    a first laser device for generating a first laser beam onto a cutting route formed in the non-metal substrate for heating the cutting route such that a scribe line is formed on the cutting route;
    a second laser device for generating a second laser beam onto the scribe line while maintaining a predetermined distance from the first laser beam; and
    a device for forming a crack by applying a cooling fluid beam onto the cutting route formed between the first laser beam and the second laser beam.

23. The apparatus as claimed in claim 22, wherein the second laser beam has a temperature lower than a melting point of the non-metal substrate.

24. The apparatus as claimed in claim 22, wherein a width of the first laser beam is smaller than a width of the second laser beam, and a width of the cooling fluid beam is smaller than the width of the first laser beam.

25. The apparatus as claimed in claim 22, a width of the first laser beam is no more than about 5 mm, and a width of the second laser beam is larger than the width of the first laser beam and is no more than about 20 mm.

26. The apparatus as claimed in claim 22, wherein a distance between the first laser beam and the cooling fluid beam is larger than zero.

27. The apparatus as claimed in claim 22, wherein the distance between the first laser beam and the cooling fluid beam is no more than about 25 mm.

28. The apparatus as claimed in claim 22, wherein a distance between the cooling fluid beam and the first laser beam is less than zero.

29. The apparatus as claimed in claim 22, wherein a distance between the cooling fluid beam and the first laser beam is zero.

30. The apparatus as claimed in claim 22, wherein a depth of the second laser beam is shallower than a depth of the first laser beam.

31. The apparatus as claimed in claim 22, wherein the second laser beam has a circular shape or an oval shape.

* * * * *